US005625324A

United States Patent [19]
Hsu et al.

[11] Patent Number: 5,625,324
[45] Date of Patent: Apr. 29, 1997

[54] ULTRA LOW NOISE FREQUENCY GENERATOR PRODUCING THE SUM OF PLURAL SIGNAL SOURCES

[75] Inventors: Steve I. Hsu, Rancho Palos Verdes; Stephen D. Taylor, Agoura, both of Calif.

[73] Assignee: Hughes Electronics, Los Angeles, Calif.

[21] Appl. No.: 482,334

[22] Filed: Jun. 7, 1995

[51] Int. Cl.⁶ .................................................. H03L 7/07
[52] U.S. Cl. ................................... 331/2; 331/25; 331/31; 331/38; 331/41; 331/56; 331/77
[58] Field of Search .......................... 331/2, 25, 31, 331/38, 41, 46, 56, 74, 77

[56] References Cited

U.S. PATENT DOCUMENTS

| | | | |
|---|---|---|---|
| 2,756,331 | 7/1956 | Foster et al. | 331/38 |
| 5,373,265 | 12/1994 | Davis et al. | 332/151 |
| 5,408,201 | 4/1995 | Uriya | 331/38 |
| 5,422,604 | 6/1995 | Jokura | 331/46 |

*Primary Examiner*—Siegfried H. Grimm
*Attorney, Agent, or Firm*—Leonard A. Alkov; Wanda K. Denson-Low

[57] ABSTRACT

The frequencies of N oscillators are summed to provide a signal generator output signal. Because the phase noise power spectral densities of the oscillators add as power, the frequency summed output exhibits a noise degradation over a single oscillator of only 10 log(N). The signal generator is implemented to assure independence of the oscillator noise contributions, with phase locking the oscillators to a common frequency for ease of spurious signal control.

21 Claims, 4 Drawing Sheets

ULTRA LOW NOISE FREQUENCY GENERATOR PRODUCING THE SUM OF PLURAL SIGNAL SOURCES

This invention was made with Government support under Contract Wildflower awarded by the Government. The Government has certain rights in this invention.

TECHNICAL FIELD OF THE INVENTION

This invention relates to reference signal generators, and more particularly to ultra low noise signal generators.

BACKGROUND OF THE INVENTION

The primary purpose of the invention is to increase the carrier frequency of a low noise reference frequency source while minimizing the loss in carrier-to-noise ratio. A principal application is for radar exciters, which demand the best possible noise performance to minimize the spreading of main lobe clutter into otherwise clutter free frequency regions. To achieve this performance, a typical exciter derives all operating frequencies from one or more low noise crystal reference oscillator operating in the 100 MHz region. Because the radar operates at microwave frequencies, however, this frequency must be increased.

Current techniques generally employ frequency multiplication of a reference oscillator to achieve the desired operating frequency. This multiplication is variously based on the use of such devices as varactors, step recovery diodes, transistors, and harmonic phase-locked loops. The principal disadvantage of these approaches is that they increase the phase noise by 20 log(N). That increase is 10 log(N) more than the multiple-oscillator technique of the present invention.

Cryogenically cooled resonators (sapphire ring resonators, dielectric resonators, superconducting thick film resonators, etc.) can be used to provide low noise performance directly at the desired output frequency but incur the complexity of cryogenic cooling of a relatively large device. Additionally, the technology of these devices is largely in early stages of maturity and generally regarded as higher risk. Performance under vibration is also a concern and generally has not been characterized.

SUMMARY OF THE INVENTION

A low noise reference frequency signal generator is described, which comprises N signal sources for producing N signals each having a signal frequency, and circuitry for summing the frequencies of the N signals to produce a signal generator output signal having an output frequency which is the sum of the signal frequencies of the N signals. The signal generator output signal is characterized by low noise, resulting from the phase noise spectral power density contributions of the individual signal sources which add in power. In a preferred implementation, all of the signal frequencies of the N signal sources are identical frequencies, and the frequency of the generator output signal is N times the identical signal frequency.

The summing circuitry includes mixing circuitry for mixing two of the N signals to provide a mixer signal output having a sum frequency component whose frequency is the sum of the frequencies of the two signals, and a band pass filter for isolating the sum frequency component.

In accordance with a further aspect of the invention, the signal generator further includes circuitry for phase locking the N signal sources to a common frequency. Each of the N signal sources comprises a voltage controlled crystal oscillator or other type of low noise oscillator, and the phase locking circuitry includes a phase lock feedback loop arranged for feedback control of each of the voltage controlled crystal oscillators.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The invention provides a means of increasing the frequency of a reference signal, but with significantly less phase noise degradation than obtained using conventional frequency multiplication processes. Frequency multiplying circuits decrease the signal-to-sideband phase noise power ratio by a factor of 20 log(N), where N is the frequency multiplication factor. In accordance with the invention, the frequencies of N oscillators with independent sideband noise components are summed. Because the phase noise power spectral densities of the oscillators add as power, the frequency summed output exhibits a noise degradation over a single oscillator of only 10 log(N). For ten oscillators, by way of example, the advantage of summing versus multiplying frequencies is 10 dB.

Figure 1:
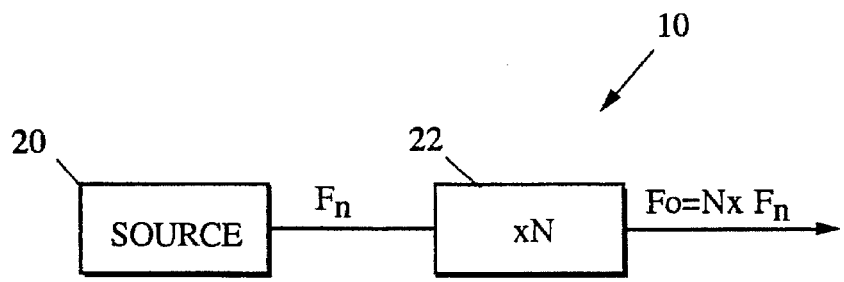
FIG. 1 is a block diagram illustrating the conventional frequency multiplication circuit for generating a higher frequency signal from a reference signal.
Figure 2:
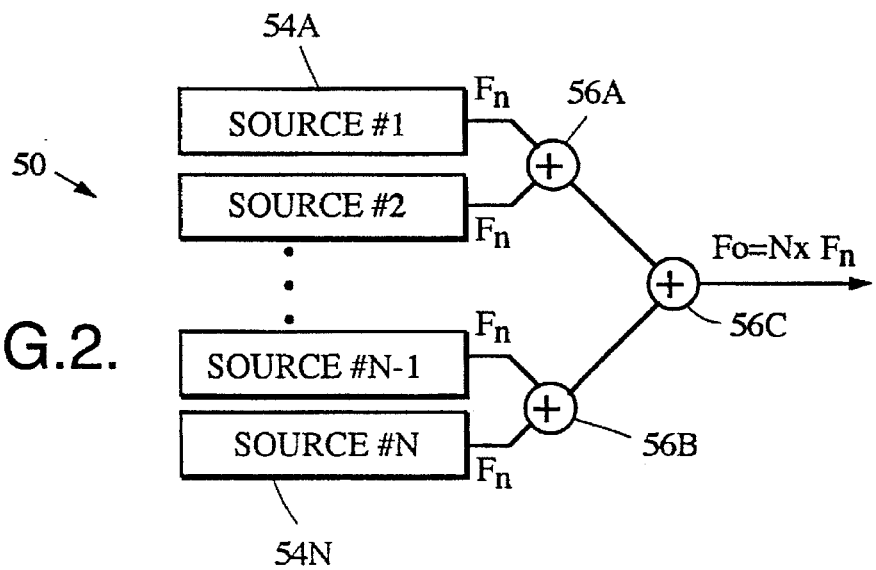
FIG. 2 is a simplified block diagram of a signal generator employing a combination of signal outputs from multiple sources in accordance with the invention.

FIG. 1 shows the architecture of a conventional frequency multiplier 10. FIG. 2 illustrates in a general sense the frequency summed approach in accordance with the invention. Non-rigorous analyses of the conventional frequency multiplier arrangement (FIG. 1) and of the multiple combined source arrangement (FIG. 2) are given below to indicated a theoretical basis of the invention. These analyses are simplified to the extent that the noise modulation is considered narrow band FM, with only a single pair of modulation sidebands resulting from any modulating frequency component. Additionally, in a narrow measurement bandwidth (1 Hz) at some modulation frequency offset, $\omega_m$, from the carrier, the carrier's sideband noise spectrum can be assumed to be due to purely sinusoidal modulation without significant loss of accuracy.

The conventional approach used to translate a reference source to a higher operating frequency shown in FIG. 1 feeds the signal from a single reference oscillator 20 through a suitably nonlinear device 22 to produce harmonics of the oscillator frequency. The reference signal and its associated phase noise can be represented as $$e_r(t) = A \sin(\omega_r t + \phi_n \sin(\omega_n t + \Theta_n))$$

where $\omega_r$ is the reference frequency, and $\phi$ is the peak phase noise modulation in some narrow bandwidth at frequency $\omega_n$ and phase $\Theta_n$.

The phase modulation index is equal to $\phi_n$, and the resulting modulation sideband to carrier ratio (SB/C) is $\phi_n/2$, or expressed in decibels $$SB/C = 20 \log(\phi_n/2) \, dB$$

Frequency multiplication by an integer factor N, which also multiplies any phase modulation components by the same factor, will produce an output $$e_0(t) = A' \sin(N\omega_r t + N\phi_n \sin(\omega_n t + \Theta_n))$$

The phase modulation index is now $N \cdot \phi_n$ and the sideband-to-carrier ratio is $N \cdot \phi_n/2$, or in decibels $$SB/C = 20 \log(N \cdot \phi_n/2) = 20 \log(\phi_n/2) + 20 \log(N) \, dB$$

which is 20 log (N) degraded from the reference.

The system 50 of FIG. 2 accomplishes the frequency translation by summing the frequencies of N identical oscillators 54A–54N to produce an output frequency that is N times higher than the individual oscillator frequencies. The oscillator output frequencies are summed by devices 56A–56C to produce an output Of. The devices 56A–56C can be, for example, mixer devices and band pass filter (BPF) circuits for isolating only the sum component from the nonlinear mixing operation. The output signal can be represented as $$e_o(t) = A' \sin\left( N\omega_r t + \sum_{i=1}^{N} \phi_{ni} \sin(\omega_n t + \Theta_{ni}) \right)$$

Because the phases $\Theta n_i$ of the oscillators 54A–54N are assumed to be independent random variables for all i, where i is the oscillator number from 1 to N, the summation of the N phase noise contributions does not occur coherently, but rather as phase noise power spectral density (PNSD) where $$PNSD = \sum_{i=1}^{N} (\phi_n/\sqrt{2})^2$$

If the N oscillators are assumed to have equal noise performance then the magnitudes of the phase noise deviations will be equal and the PNSD simplifies to $$PNSD = N(\phi_n/\sqrt{2})^2$$

and the total rms phase deviation becomes $$\Phi_{rms} = \sqrt{PNSD} = \sqrt{N} \, (\phi_n/\sqrt{2})$$

Peak phase deviation at some modulation frequency $\omega_n$ is $$\Phi_{peak} = \sqrt{2} \, \sqrt{N} \, (\phi_n/\sqrt{2}) = \sqrt{N} \, (\phi_n)$$

The noise sideband to carrier ratio (SB/C) is then $$SB/C = 20 \log(\Phi_{peak}/2) = 20 \log(\sqrt{N} \, (\phi_n)/2) \, dB$$

$$SB/C = 20 \log(\phi_n/2) + 10 \log N \, dB$$

which is 10 log N degraded from an individual reference, which as previously stated, represents 10 log N less noise degradation than frequency multiplication.

In a practical application, the N oscillators would not be running completely independently but would be phase locked to insure a common operating frequency for prevention of spurious signal generation problems in the frequency summing process. The bandwidth of the phase locking, and therefore the phase influence range, would be kept narrow (generally in the range of a few Hertz to a few hundreds of Hertz) to maintain independence of oscillator phase noise contributions at kilohertz and above noise modulation frequencies, where noise performance is often most critical. This noise independence is critical to achieving the noise improvement from summing signal sources rather than frequency multiplying a single source.

Figure 3:
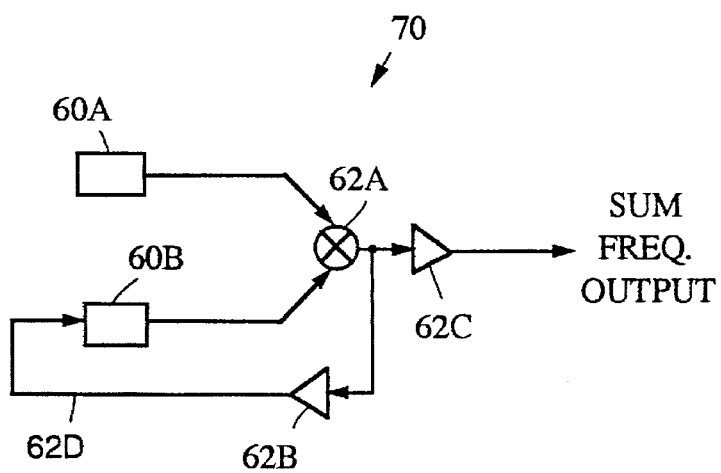
FIG. 3 is a block diagram of a two source implementation of a reference signal generator in accordance with the invention.

An exemplary hardware efficient means of effecting the oscillator frequency summing and phase locking is shown for a two oscillator configuration in FIG. 3. Crystal controlled oscillator 60A functions as the reference for the phase locked loop that encloses the voltage controlled oscillator 60B being phase locked, the mixer 62A, and the loop error signal amplifier and frequency compensation 62B. The mixer 62A functions to produce the sum and difference frequencies from the 60A and 60B oscillator frequency inputs. When phase locked the frequencies of oscillators 60A and 60B are equal and the difference frequency is zero or DC. The DC output voltage from the mixer, however, will vary as a function of the phase difference between the two input signals. This phase sensitivity of mixer 62A is employed to provide an error signal to oscillator 60B to establish and maintain phase lock between the two oscillators. The phase locking establishes precisely identical operating frequencies for the two oscillators. The amplifier and frequency compensation 62B in the error signal path provide the amplification and frequency compensation that are typically employed in feed back control circuits to establish the loop control bandwidth and stability.

Not shown in FIG. 3 are the elements that would be needed to establish phase lock on initial power up. The approaches and techniques that can be used to accomplish this phase locking are many and diverse and are well known to those versed in the art of feedback control and particularly phase locked loop design.

The mixer 62A also provides a sum frequency signal component that is processed through amplifier 62C to provide the desired output. A novel feature of the architecture of FIG. 3 is the use of the mixer to function as the phase locked loop phase detector as well as to provide the frequency summing. Most significantly, the frequency summing provided by the architecture of FIG. 3 produces an output signal at twice the frequency of the reference oscillators but with phase noise modulation sidebands that are only increased by 3 dB rather than the 6 dB increase that would have resulted from conventional frequency multiplication of a single oscillator by two.

If the two oscillators were not phase locked as described above, the inevitable slight difference in the operating frequencies of the oscillators would produce mixer intermodulation products offset from the desired sum frequency output by integer multiples of the oscillator difference frequency. Because this frequency difference is very small for identically designed oscillators, practical bandpass filtering of the mixer output could not filter out the intermodulation products.

Figure 4:
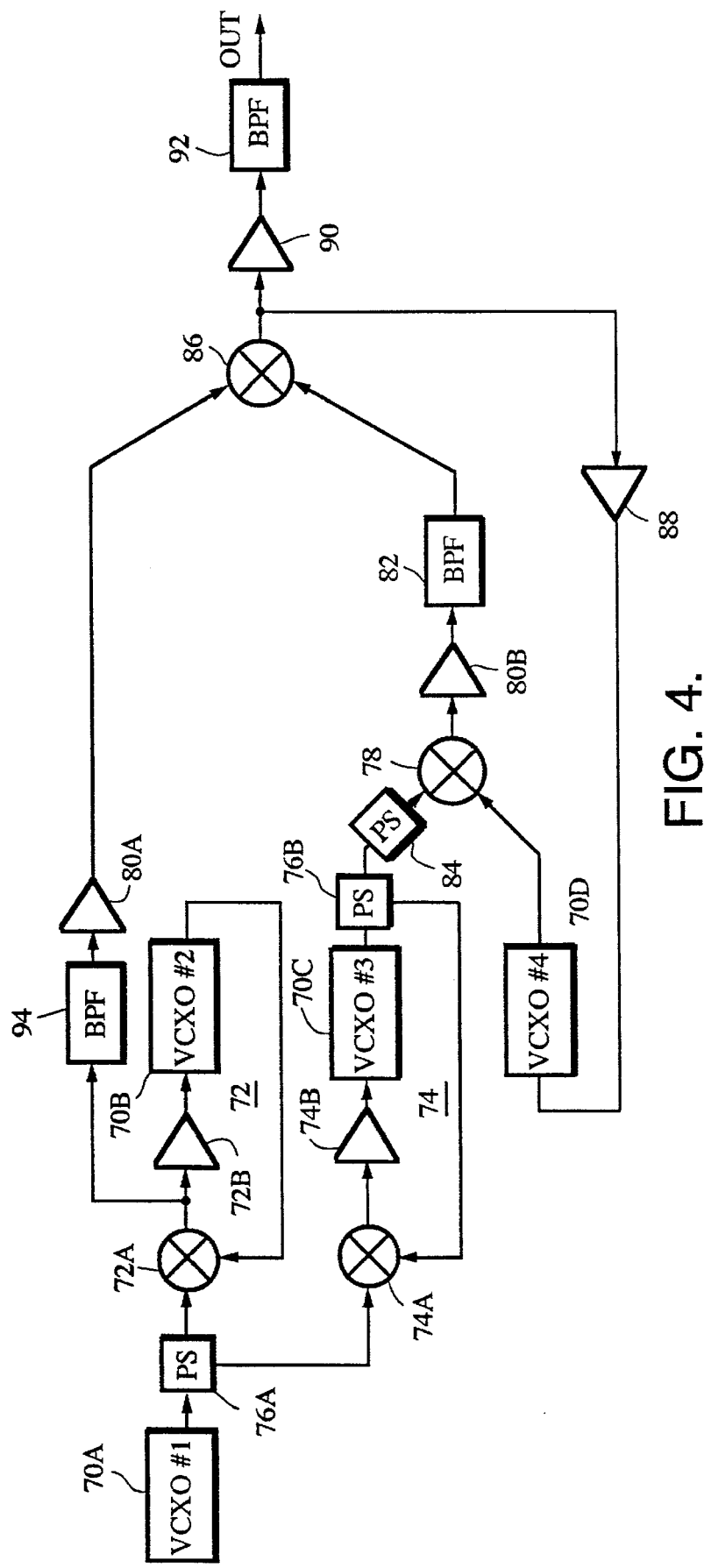
FIG. 4 is a block diagram of a four source implementation of a reference signal generator embodying the invention.

FIG. 4 illustrates an exemplary configuration to combine four oscillators 70A–70D, each operating at an exemplary frequency of 80 MHz, in order to produce a signal at four times the oscillator frequency, i.e., 320 MHz. Oscillator 70A provides the master frequency reference to which the other three oscillators are effectively phase locked. Oscillator 70B is directly phase locked to oscillator 70A using an architecture that is similar to the architecture of FIG. 3. Phase locked loop 72 produces a sum frequency output at 160 MHz from the mixer 72A and processes it through bandpass filtering 94 and amplification 80A to the next stage of frequency summation in mixer 86.

Phase locked loop 74 functions to phase lock oscillator 70C to the reference 70A. The output from oscillator 70C at 80 MHz is split by the power splitter 76B to provide the feedback signal to the mixer 74A, which functions as a phase detector, and the signal to the frequency summing mixer 78 through phase shifter 84. The phase shifter 84 functions to establish a quadrature input signal phase relationship to mixer 78 that will be subsequently explained. The other input to mixer 78 is provided by oscillator 70D, which is also phase locked to produce precisely the same frequency (80 MHz in the exemplary configuration of FIG. 4) as the other oscillator as will be subsequently shown. Mixer 78 sums the two input signal frequencies to produce a 160 MHz output signal, which is subsequently amplified and filtered by elements 80B and 82, respectively, processed through a phase shifter that will be subsequently explained, and applied to an input of mixer 86. Mixer 86 sums the two input signal frequencies, 160 MHz for the exemplary frequency plan, to produce the desired output frequency (320 MHz in the exemplary design) which is equal to four times the individual oscillator frequency. The sum frequency signal is processed through amplifier 90 and band pass filter 92 to the output.

The difference frequency signal from mixer 86 is a DC voltage that is dependent on the phase difference between the two nominally equal frequency mixer inputs and is used as the control signal to phase lock oscillator 70D. Thus, the third phase locked loop is closed around oscillator 70D, mixer 78, amplifier 80B, band pass filter 82, mixer 86, and amplifier 88. The net effect of the phase locking in FIG. 4 is to force oscillators 70B, 70C, and 70D to operation at precisely the frequency of oscillator 70A. This condition insures that all frequency components generated by the architecture fall only at integer multiples of the frequency of oscillator 70A, 80 MHz in the exemplary design. Thus, no spurious signal frequency components are generated close to the desired signal frequency by the mixing processes.

For the exemplary configuration of FIG. 4, the 80 MHz reference frequency has been increased by a factor of 4 to 320 MHz. The first level frequency summation in mixers 72A and 78 increases the frequency to 160 MHz and, due to the noise power summation, also increases the phase noise power spectral density by a factor of 3 dB relative to the noise spectral density of the individual oscillators. The second level frequency summation from 160 to 320 MHz takes place in mixer 86 and produces an additional 3 dB increase in power spectral density to result in the output signal having a phase noise power spectral density that is 6 dB higher than the individual oscillators.

If instead of using the disclosed frequency summing technique, the conventional approach of frequency multiplying a signal oscillator by a factor of 4 were used, the phase noise power spectral density of the output would have been 12 dB (20 log 4 dB) higher than that of the reference oscillator. Frequency summation of four oscillators thus yields a 6 dB improvement over the conventional frequency multiplication approach.

An Eight Oscillator Configuration

The combination of eight to ten reference oscillators is a reasonable compromise between the noise improvement obtained, 9 to 10 dB, versus the quantity of hardware required. Every doubling in the number of oscillators results on a 3 dB noise improvement over multiplication. Thus, 16 to 20 oscillators would be required for an additional 3 dB improvement.

Figure 5:
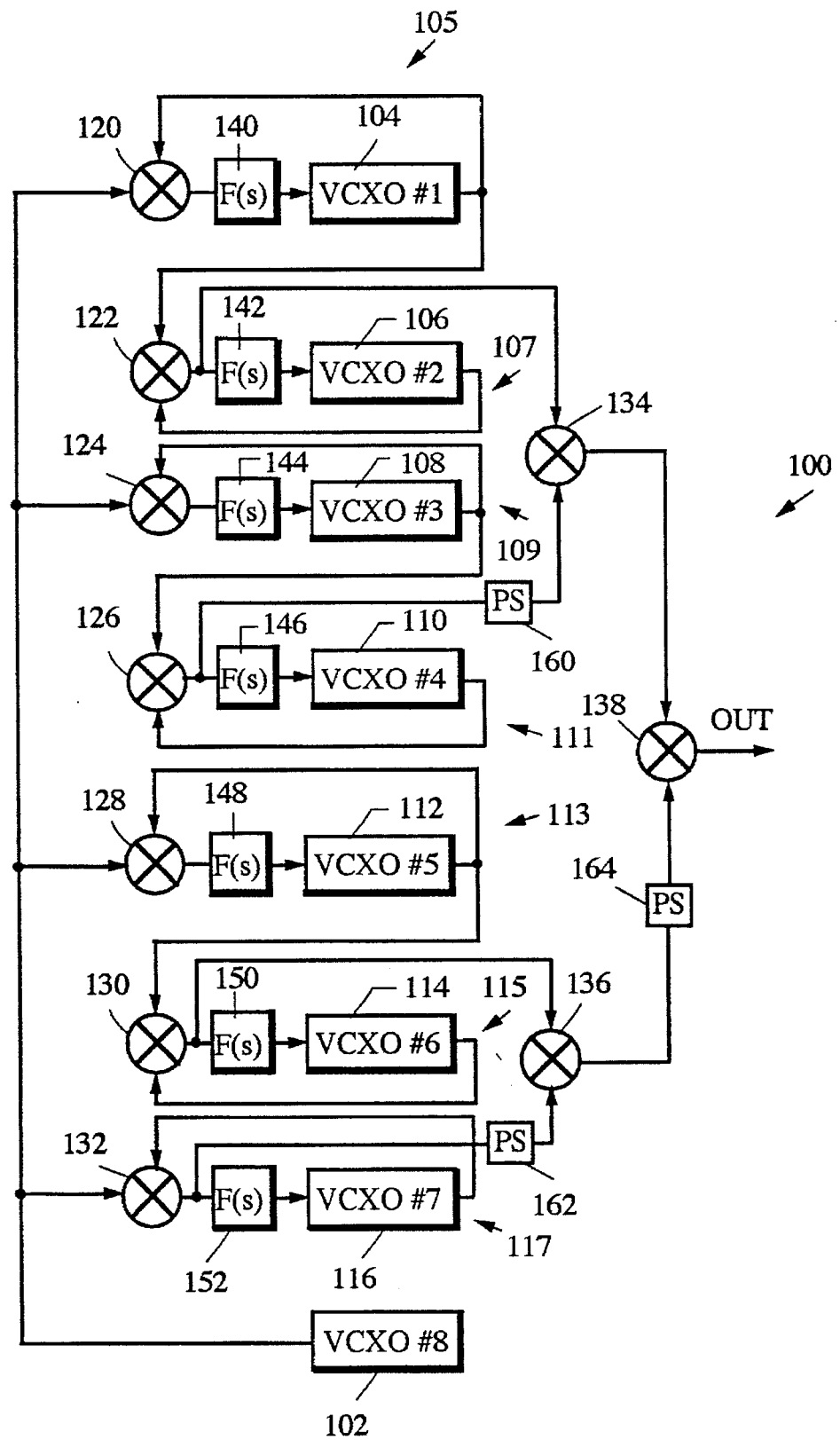
FIG. 5 is a block diagram of an eight source reference signal generator in accordance with the invention.

A system 100 to interlock and combine eight oscillators in accordance with the invention is shown in FIG. 5. Crystal oscillator 102 provides the reference to which oscillators 104, 108, 112, and 116 are phase locked. Oscillators 106, 110, and 114 are locked to oscillators 104, 108, and 112, respectively. The narrow band nature of the phase locked loops (PLLs) 105, 107, 109, 111, 113, 115 and 117 ensures that noise beyond approximately 100 Hz from the carrier of any oscillator is not translated to other oscillators to preserve the independence of phase noise contributions to the summed frequency output.

Similar to the configurations of FIGS. 3 and 4, the system 100 of FIG. 5 uses mixer-based phase detectors 122, 126, 130 and 132 in four of the PLLs (107, 111, 115 and 117) to provide the phase error output to the PLL as well as the sum frequency of the frequency of the reference signal to the PLL and the frequency of the oscillator feedback signal.

As previously discussed, a mixer can be used for frequency summing of respective frequencies of two signals and as a phase detector. In the embodiment of FIG. 5, some mixers (122, 126, 130 and 132) are used both as a phase detector in a PLL and as a frequency summing device, some mixers (120, 124, 128) are used as a phase detector only in a PLL, and certain mixers (134, 136 and 138) are used to provide only a summing function. For use as a phase detector in a PLL, the mixer must be able to provide a DC output signal voltage (not AC coupled) that, after subsequent amplification, will drive the voltage controlled oscillator (VCO) frequency control port. The phase detector must provide sufficiently high sensitivity to input signal phase changes to establish a high signal-to-noise ratio inside the PLL for achievement of the desired PLL output signal noise spectrum requirements. In general, the difference frequency output from a mixer that is driven by two signals of equal frequency contain a DC signal V that is equal to $$V = K \cos(\Delta\Theta) \text{ volts}$$

where $\Delta\Theta$ is the phase difference between the two input signals in radians and K is the peak output voltage from the mixer. From the equation, it is seen that when the input signals are in a quadrature phase relationship ($\Delta\Theta$ is equal to $\pi/2$ radians or 90 degrees), the output voltage is equal to zero volts. When locked the phase locked loop drives the output signal from the phase detector mixer to nominally zero volts DC which, from the equation for V above, means that the two phase detector input signals are placed at or very close to phase quadrature.

The sensitivity of the mixer based phase detector is given by the derivative of V with respect to $\Delta\Theta$ and is given by $dV/d\Delta\Theta = -K \sin(\Delta\Theta)$ volts/radian The equation for $dV/d\Delta\Theta$ above indicates a sensitivity of $-K$ volts/radian for $\Delta\Theta = \pi/2$ radians, which is a maximum sensitivity operating point for the phase detector. Thus, the natural action of the phase locked loop to drive the phase detector mixer output to zero volts places the mixer inputs in a phase quadrature relationship which yields maximum phase detection sensitivity as desired. Because high phase detector sensitivity and correspondingly PLL signal-to-noise ratio performance are dependent on the value K, a high output level mixer is desired in the PLL application.

Figure 6:
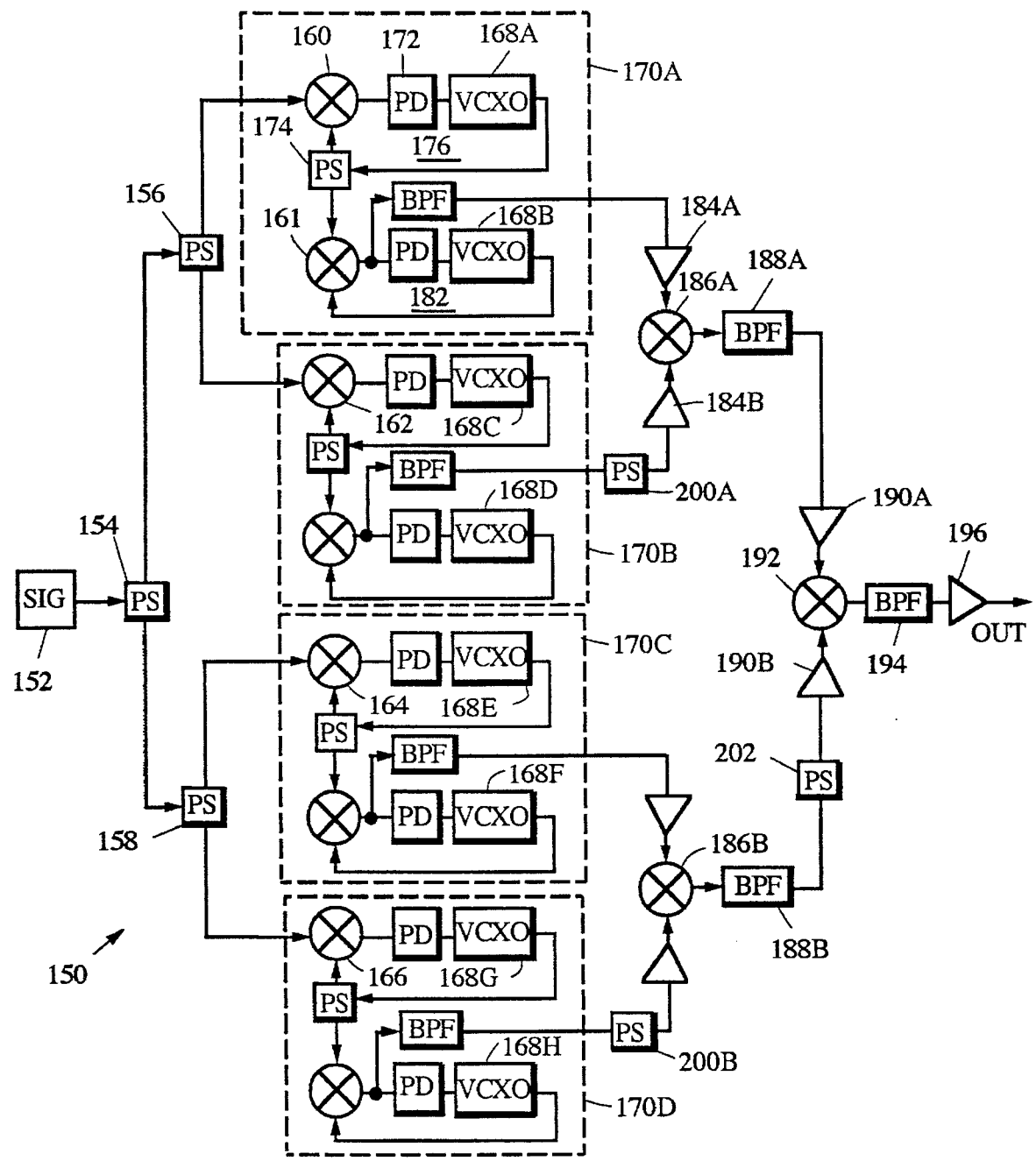
FIG. 6 is a block diagram of an alternate embodiment of an eight source reference signal generator embodying the invention.

When a mixer is used to sum the frequencies of two identical frequency input signals, minimum conversion loss is achieved when the input signals are in phase quadrature. It can be shown mathematically that the difference in insertion loss for the case of phase quadrature inputs versus in-phase or 180 degree out-of-phase inputs is 6 dB. For the mixers of FIGS. 3-6 that are used to provide a PLL phase detection function as well as a frequency summation function, the feedback properties of the PLL will function to establish a near zero volt DC output by placing the input signals in phase quadrature as discussed. Thus, the PLL has inherently established the desired input signal phase relationship to achieve maximum sum frequency component output. For mixers that are not inside a PLL and perform only a frequency summing function, some means of phasing the inputs is required. The phase shifter 84 in FIG. 4, phase shifters 160, 162 and 164 in FIG. 5, and phase shifters 200A, 200B and 202 in FIG. 6 provide this input signal phasing to achieve maximum output performance.

To provide frequency summing functions, the mixer must operate at a higher output frequency (the sum of the two input frequencies) and provide a sufficiently high output signal level to maintain signal-to-noise ratio performance. 50 ohm output impedance at the input and output ports at the frequencies of operation is also generally required to maximize power transmission and avoid signal reflection components in 50 ohm systems. For combined use to provide both a phase detector and frequency summing requirements outlined above, the mixer must satisfy both the phase detector and frequency summing requirements outlined above. The dual functionality of the mixer can be achieved by simply tapping off of the output signal line and routing one line to the PLL video amplification and frequency compensation networks, F(s), and the second line to the band pass filters BPF, as shown in FIGS. 3, 4, 5 and 6. No additional circuitry is required.

The dual function feature of mixer-based phase detectors 122, 126, 130 and 132 removes the need for four separate mixers that would otherwise be needed to provide the first level of frequency summing.

The second level of summing in the system 100 is provided by two mixers 134 and 136 to produce two signals at four times the frequency of the individual oscillators, and the final summing at mixer 138 combines the two outputs from the second level of summing to produce the final output at 8 times the oscillator frequency.

The output signal phase noise beyond the loop bandwidth is increased by 9 dB over the noise of any single oscillator. Frequency multiplication of a single oscillator by 8 would have increased the noise by 18 dB.

A variation on the system 100 of FIG. 5 is shown in FIG. 6. In this alternate system 150, an external signal source 152 is used to provide a master frequency reference for the frequency combined oscillators 168A–168H, with both the external source 152 and the oscillators 168A–168H operating at the same frequency, 112.5 MHz in this example. This external signal could, for example, be provided by an ultra-stable frequency source to establish long term frequency stability. Because the frequency of the external signal is not directly summed with the other oscillators, its noise contribution beyond the PLL bandwidths does not contribute to the combined source output noise. Thus, the external signal is used to phase lock four of the eight oscillators directly, and the other four oscillators are phase locked to the first four oscillators. The frequency of the external source must match the frequencies of the eight signals sources so that phase lock can be achieved.

The phase shifters 200A, 200B and 202 in the output frequency summing network are set to provide quadrature signals to the two output levels of combining mixers 186A, 186B and 192. That condition places the difference frequency dc term at zero volts and maximizes the fidelity and amplitude of the sum term output for saturated mixer operation.

Additionally, the architecture of the system 150 of FIG. 6 uses four identical building block elements 170A–170D, each comprising two PLLS and the summed output frequency path, that could be implemented as integrated circuits. FIG. 6 also shows the detail of the bandpass filters, amplifiers, and power splitters that would be required.

The building block element 170A will be described in detail; the remaining elements 170B–170C are identical. This element includes two PLLs 176 and 182. PLL 176 is defined by mixer 160, loop amplifier and filter 172, VCXO 168A and power splitter 174. A portion of the VCXO 168A output thus serves as one input to mixer 160; the other input is the reference signal from power splitter 156. Thus, the output from VCXO 168A is phase locked to the reference signal by operation of PLL 176.

The second PLL 182 comprises mixer 161, loop amplifier and filter 180 and VCXO 168B. One output of the power splitter 174 serves as an input to mixer 161, the other input being the output of the VCXO 168B. Thus, the VCXO 168B is phase locked to the VCXO 168A by operation of PLL 182. The RF output of the mixer 161 is split off to BPF 178, which isolates the sum frequency component from the mixer output at 225 MHz. The DC mixer output is passed to the amplifier and filter 180 comprising the PLL 182.

The BPF 178 output is amplified by amplifier 184A, and mixed with the corresponding output from circuit element 170B from amplifier 184B at mixer 186A. The output of mixer 186A is passed through BPF 188A, which isolates the sum frequency component at 450 MHz. This sum frequency component is amplified at amplifier 190A and mixed with a corresponding sum frequency component at 450 MHz from the circuit elements 170C and 170D, which has been isolated by BPF 188B and amplified by amplifier 190B. The output of mixer 192 is passed through a BPF 194 to isolate the sum frequency component, which is amplified by amplifier 196 to provide the system output signal at 900 MHz. Phase shifters 200A, 200B and 202 function to place the input to mixers 186A, 186B and 192 in phase quadrature, as previously discussed.

The invention provides superior performance to techniques that use nonlinear devices or harmonic phase locked loops to multiply the reference frequency. These techniques increase the sideband phase noise by 20 log (N), where N is the effective frequency multiplying factor. If a portion of this frequency translation is accomplished by summing the frequencies of a number of reference oscillators in accordance with the invention, then that portion of the translation will increase the sideband noise power by only 10 log(K), where K is the number of oscillators summed. This comparison assumes all oscillators have identical noise performance. This easily achieved noise improvement offsets the increased complexity of the multiple-oscillator approach.

The configurations described above use identical oscillators in the frequency summation architectures. That approach enables the replication of hardware elements to build up the multi-oscillator configurations and also simplifies the control of spurious signal frequency generation. It is noted, however, that configurations that frequency sum oscillators that are not operating at the same frequency also represent embodiments of the present invention. For example, oscillators that share a common frequency factor of 10 MHz, such as the set of oscillator frequencies of 100, 110, 120 190 MHz could be frequency summed in a phase locked architecture to obtain a 520 MHz output with all spurious signal products occurring at multiples of 10 MHz. (No spurious signal would be closer than 10 MHz from the output signal carrier frequency.)

Alternatively, oscillators at different frequencies that have no common frequency factors or particular relationship could be directly frequency summed in a network of mixers to generate the sum and difference frequencies of pairs of signals, filters to select the sum frequency outputs from the mixers and attenuate unwanted other frequency products, and amplifiers to maintain signal power levels. Phase locking of the oscillators would generally not be provided or feasible. Although spurious signal control could be more difficult than phase locked approaches with equal or related frequencies, judicious design of the frequency plan could make this approach feasible.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A low noise, non-programmable, fixed reference frequency signal generator, comprising:

N signal sources for producing N signals each having a signal frequency, wherein all of said signal frequencies of the N signal sources are identical frequencies and said frequency of said generator output signal is N times said identical signal frequency;

circuitry for summing the frequencies of the N signals to produce a signal generator output signal having a non-programmable, fixed output frequency which is the sum of the signal frequencies of the N signals; and circuitry for phase locking said N signal sources to a common frequency, wherein said signal generator output signal is characterized by lower noise than is obtained by frequency multiplication of a single source by a factor N to obtain said output frequency.

2. The signal generator of claim 1 wherein said summing circuitry comprises mixing circuitry for mixing two of said N signals to provide a mixer signal output having a sum frequency component whose frequency is the sum of the frequencies of said two of said N signals, and a band pass filter for isolating said sum frequency component.

3. The signal generator of claim 1 wherein each of said N signal sources comprises a voltage controlled crystal oscillator, and said circuitry for phase locking said N signal sources to a common frequency includes a phase lock feedback loop arranged for feedback control of said each of said voltage controlled crystal oscillators.

4. The signal generator of claim 1 further comprising a reference frequency signal source having a reference frequency, and said phase locking circuitry phase locks said N signal sources to said reference frequency of said reference frequency source, wherein said common frequency is said reference frequency.

5. The signal generator of claim 4 wherein said reference frequency signal source comprises a crystal oscillator.

6. A low noise microwave frequency signal generator for generating an output signal at a microwave frequency, comprising:

means for providing a reference signal having a reference frequency equal to 1/Nth of the microwave frequency;

N voltage controlled oscillators (VCOs) arranged in N phase locked loops (PLLs) arranged in pairs, wherein a first VCO of each pair is phase locked to said reference signal and the second VCO of each pair is phase locked to said first VCO of the pair;

N/2 first level frequency summing circuits, one said circuit for each PLL pair for providing N/2 first level sum signals at a frequency equal to the sum of the frequencies of said first and second VCOs in said pairs; and N/4 second level frequency summing circuits, each responsive to two of said first level sum signals for providing N/4 second level sum signals at a frequency equal to the sum of the frequencies of said two first level sum signals.

7. The signal generator of claim 6 wherein said second PLL of each pair comprises a dual function mixer-based phase detector circuit and said second VCO, said phase detector circuit providing a control signal to said second VCO indicative of the difference in phase between the first and second VCOs, said phase detector circuit further providing a sum output having a frequency equal to the sum of the frequencies of the first and second VCOs.

8. The signal generator of claim 7 wherein said control signal is a DC signal and said sum output is at RF.

9. The signal generator of claim 6 wherein said second level summing circuits each includes a mixer circuit for providing a mixer output signal component as said second level sum signal.

10. A low noise, non-programmable, fixed reference frequency signal generator, comprising:

N signal sources for producing N signals each having a signal frequency;

circuitry for summing the frequencies of the N signals to produce a signal generator output signal having a non-programmable, fixed output frequency which is the sum of the signal frequencies of the N signals, and circuitry for phase locking said N signal sources to a common frequency, wherein said N signal source signal frequencies are integer multiples of said common frequency.

11. The signal generator of claim 10 wherein all of said signal frequencies of the N signal sources are identical frequencies, and said frequency of said generator output signal is N times said identical signal frequency.

12. The signal generator of claim 10 wherein said summing circuitry comprises mixing circuitry for mixing two of said N signals to provide a mixer signal output having a sum frequency component whose frequency is the sum of the frequencies of said two of said N signals, and a band pass filter for isolating said sum frequency component.

13. The signal generator of claim 12 wherein each of said N signal sources comprises a voltage controlled crystal oscillator, and said circuitry for phase locking said N signal sources to a common frequency includes a phase lock feedback loop arranged for feedback control of said each of said voltage controlled crystal oscillators.

14. The signal generator of claim 10 further comprising a reference frequency signal source having a reference frequency, and said phase locking circuitry phase locks said N signal sources to said reference frequency of said reference frequency source, wherein said common frequency is said reference frequency.

15. The signal generator of claim 14 wherein said reference frequency signal source comprises a crystal oscillator.

16. A low noise, non-programmable, fixed reference frequency signal generator, comprising:

N signal sources for producing N signals each having a signal frequency, wherein N−1 of said signal sources are phase locked to an Nth one of said N signal sources; and circuitry for summing the frequencies of the N signals to produce a signal generator output signal having a non-programmable, fixed output frequency which is the sum of the signal frequencies of the N signals, wherein said signal generator output signal is characterized by lower noise than is obtained by frequency multiplication of a single source by a factor N to obtain said output frequency.

17. The signal generator of claim 16 wherein said N signal source signal frequencies are identical, and wherein said output frequency is N times the frequency of any one of said N signal sources.

18. A low noise, non-programmable, fixed reference frequency signal generator, comprising:

N signal sources for producing N signals each having a signal frequency;

a first phase lock loop (PLL) for phase locking the frequency of a first one of said signal sources to the frequency of a second one of said signal sources, said first signal source comprising a voltage controlled oscillator (VCO), said PLL comprising a dual function mixer-based phase detector circuit and said VCO, said phase detector circuit providing a control signal to said VCO indicative of the difference in phase between the first and second signals provided by the first and second signal sources, said phase detector circuit further providing a first sum output having a frequency equal to the sum of the frequencies of the first and second signal sources; and circuitry for summing the frequencies of the N signals to produce a signal generator output signal having a non-programmable, fixed output frequency which is the sum of the signal frequencies of the N signals, wherein said signal generator output signal is characterized by lower noise than is obtained by frequency multiplication of a single source by a factor N to obtain said output frequency.

19. The signal generator of claim 18 wherein said control signal is a DC signal and said sum output is at RF.

20. The signal generator of claim 18 further comprising:

a second PLL for phase locking the frequency of a third one of said signal sources to the frequency of a fourth one of said signal sources, said third signal source comprising a VCO, said PLL comprising a second dual function mixer-based phase detector circuit and said third signal source VCO, said second phase detector circuit providing a control signal to said third signal source VCO indicative of the difference in phase between the third and fourth signals provided by the third and fourth signal sources, said second phase detector circuit further providing a second sum output having a frequency equal to the sum of the frequencies of the third and fourth signal sources; and frequency summing means responsive to the first and second sum outputs for providing a third output having a frequency equal to the sum of the frequencies of the first and second outputs.

21. The signal generator of claim 20 wherein said frequency summing means is a mixer circuit for providing a mixer output signal component as said third output.

* * * * *